United States Patent
Leu et al.

(10) Patent No.: US 8,963,421 B2
(45) Date of Patent: Feb. 24, 2015

(54) ELECTROLUMINESCENT DEVICE INCLUDING MOISTURE BARRIER LAYER

(75) Inventors: Jihperng Leu, Taipei (TW); Shu-Hao Syu, New Taipei (TW); Hung-En Tu, Chiayi (TW); Chih Wang, Taichung (TW)

(73) Assignee: National Chiao Tung University, Hsinchu (TW)

(*) Notice: Subject to any disclaimer, the term of this patent is extended or adjusted under 35 U.S.C. 154(b) by 0 days.

(21) Appl. No.: 13/616,442

(22) Filed: Sep. 14, 2012

(65) Prior Publication Data

US 2014/0077691 A1    Mar. 20, 2014

(51) Int. Cl.
*H05B 33/12* (2006.01)

(52) U.S. Cl.
USPC .......................... 313/511; 313/498

(58) Field of Classification Search
CPC ..... H01L 23/291; H01L 21/033; H01L 21/56; C23C 16/325
USPC ................ 313/498–512; 257/40, 77; 438/757
See application file for complete search history.

(56) References Cited

U.S. PATENT DOCUMENTS

| | | | |
|---|---|---|---|
| 4,696,796 A * | 9/1987 | Oka et al. | 422/88 |
| 6,888,172 B2 | 5/2005 | Ghosh | |
| 7,220,687 B2 | 5/2007 | Won | |
| 7,504,332 B2 * | 3/2009 | Won et al. | 438/622 |
| 7,733,008 B2 | 6/2010 | Ke et al. | |
| 2002/0140347 A1 * | 10/2002 | Weaver | 313/506 |
| 2009/0169770 A1 | 7/2009 | Padiyath et al. | |
| 2009/0252894 A1 | 10/2009 | McCormick et al. | |
| 2011/0052891 A1 * | 3/2011 | Takahashi et al. | 428/213 |
| 2011/0298361 A1 * | 12/2011 | Matsunaga et al. | 313/504 |

OTHER PUBLICATIONS

Chang, C.-Y., et al., Enhanced OLED performance upon photolithographic patterning by using an atomic-layer-deposited buffer layer; Organic Electronics 9:667-672 (2008).

Chen, C.W., et al., Investigation of the electrical properties and reliability of amorphous SiCN; Thin Solid Films 447-448:632-637 (2004).

Kobayashi, H., et al., Leakage current and paramagnetic defects in SiCN dielectrics for copper diffusion barriers; Applied Surface Science 254:6222-6225 (2008).

Syu, Shu-Hao, Low-temperature PECVD deposited SiCxNy/polystyrene multi-layered, high-performance moisture barrier on flexible PET film; A Thesis submitted to Department of Materials Science and Engineering-College of Engineering-National Chiao Tung University, 2012.

* cited by examiner

*Primary Examiner* — Tracie Y Green
(74) *Attorney, Agent, or Firm* — SmithAmundsen LLC; Kelly J. Smith; Dennis S. Schell

(57) ABSTRACT

An electroluminescent device includes: a substrate; an electroluminescent layered structure disposed over the substrate and including first and second electrode layers and an electroluminescent material layer disposed between the first and second electrode layers; and a moisture barrier layer in contact with the electroluminescent layered structure for preventing moisture from diffusing into the electroluminescent layered structure. The moisture barrier layer includes at least two inorganic films of a silicon-nitrogen-containing compound and at least one polymer film interposed between the inorganic films.

10 Claims, 3 Drawing Sheets

ELECTROLUMINESCENT DEVICE INCLUDING MOISTURE BARRIER LAYER

BACKGROUND OF THE INVENTION

1. Field of the Invention

This invention relates to an electroluminescent device, more particularly to an electroluminescent device including at least one moisture barrier layer having inorganic films and optionally at least one polymer film interposed between two of the inorganic films.

2. Description of the Related Art

U.S. Pat. No. 7,733,008 discloses an organic light emitting diode (OLED) that includes a substrate, an anode formed on the substrate, a first moisture barrier layer formed on the anode, a hole transport layer formed on the first moisture barrier layer, an electroluminescent layer formed on the hole transport layer, a second moisture barrier layer formed on the electroluminescent layer, a cathode formed on the second moisture barrier layer, and an encapsulation layer encapsulating at least partially all of these layers. The thickness of the first and second moisture barrier layers ranges from 1 nm to 20 nm. The first and second moisture barrier layers are made from a polymer selected from polyimide, TEFLON®, and parylene, and have a water vapor transmission rate (WVTR) ranging from 0.1 $g/m^2$/day to 50 $g/m^2$/day at 95% RH (Relative Humidity) and 39° C.

U.S. Pat. No. 7,220,687 discloses an OLED that includes a substrate, an anode formed on the substrate, an organic polymer material layer formed on the anode and having a hole transport film and an emissive film, a cathode formed on the organic polymer material layer, and an encapsulation layer deposited on the cathode. The thickness of the encapsulation layer ranges from 50 nm to 2000 nm. The encapsulation layer can be made from silicon nitride ($Si_3N_4$), silicon dioxide ($SiO_2$), or silicon oxynitride ($SiO_xN_y$). Formation of the encapsulation layer is performed by introducing precursor sources together with hydrogen into a deposition chamber during chemical vapor deposition. The introduction of hydrogen into the deposition chamber can improve the WVTR of the encapsulation layer thus formed from about $1\times10^{-2}$ $g/m^2$/day (without hydrogen) to about a range between $1\times10^{-3}$ $g/m^2$/day and $1\times10^{-4}$ $g/m^2$/day (with hydrogen) at 90% RH and 38° C. Although the use of hydrogen can reduce the WVTR of the encapsulation layer, the manufacturing costs of the OLED may be considerably increased due to the use of hydrogen in the manufacturing process.

SUMMARY OF THE INVENTION

Therefore, an object of the present invention is to provide an electroluminescent device that can overcome the aforesaid drawback associated with the prior art.

According to one aspect of this invention, there is provided an electroluminescent device that comprises: a substrate; an electroluminescent layered structure disposed over the substrate and including first and second electrode layers and an electroluminescent material layer disposed between the first and second electrode layers; and a moisture barrier layer in contact with the electroluminescent layered structure for preventing moisture from diffusing into the electroluminescent layered structure. The moisture barrier layer includes at least two inorganic films of a silicon-nitrogen-containing compound and at least one polymer film interposed between the inorganic films.

According to another aspect of this invention, there is provided an electroluminescent device that comprises: a substrate; an electroluminescent layered structure disposed over the substrate and including first and second electrode layers and an electroluminescent material layer disposed between the first and second electrode layers; and a moisture barrier layer in contact with the electroluminescent layered structure for preventing moisture from diffusing into the electroluminescent layered structure. The moisture barrier layer includes a plurality of inorganic films of silicon carbonitride. The inorganic films are stacked one above another. Assembly of the inorganic films has a water vapor transmission rate of less than $1\times10^{-2}$ $g/m^2$/day at 75% RH and 25° C.

BRIEF DESCRIPTION OF THE DRAWINGS

In drawings which illustrate embodiments of the invention.

DETAILED DESCRIPTION OF THE PREFERRED EMBODIMENTS

Figure 1:
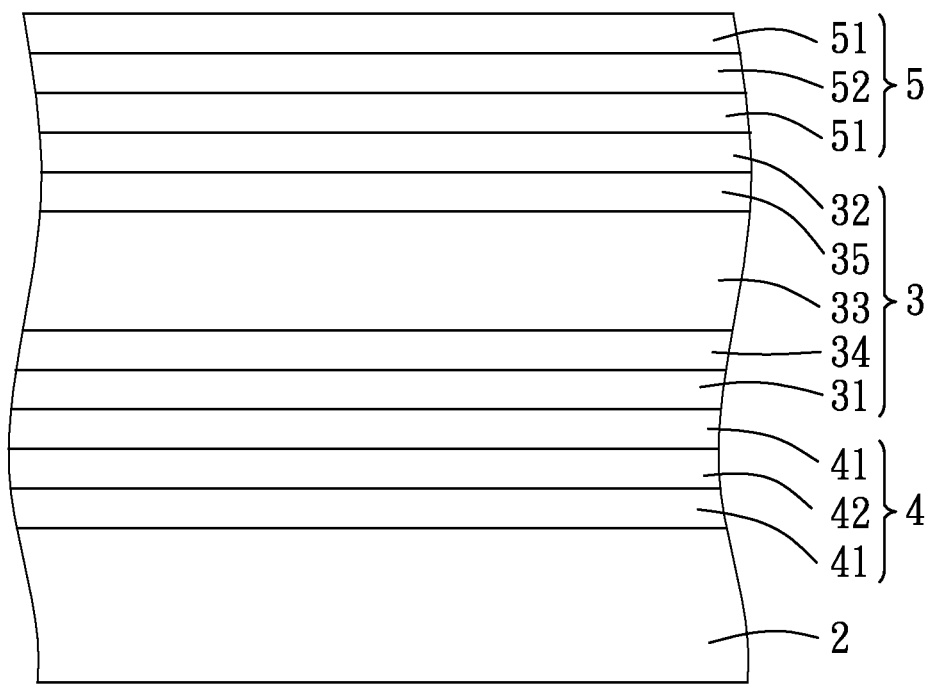
FIG. 1 is a schematic diagram of the first preferred embodiment of an electroluminescent device according to the present invention.

Before the present invention is described in greater detail with reference to the accompanying preferred embodiments, it should be noted herein that like elements are denoted by the same reference numerals throughout the disclosure.

FIG. 1 illustrates the first preferred embodiment of an electroluminescent device 100 according to the present invention. The electroluminescent device 100 can be an OLED, and includes: a substrate 2; an electroluminescent layered structure 3 disposed over the substrate 2 and including first and second electrode layers 31, 32 and an electroluminescent material layer 33 disposed between the first and second electrode layers 31, 32; a first moisture barrier layer 4 in contact with the electroluminescent layered structure 3 for preventing moisture from diffusing into the electroluminescent layered structure 3; and a second moisture barrier layer 5 disposed over the electroluminescent layered structure 3. The first moisture barrier layer 4 is interposed between the substrate 2 and the electroluminescent layered structure 3. The electroluminescent layered structure 3 is interposed between the first and second moisture barrier layers 4, 5 so that environmental moisture can be prevented from diffusing from two opposite sides of the electroluminescent layered structure 3 into the electroluminescent layered structure 3.

The electroluminescent layered structure 3 further includes a hole transporting layer 34 interposed between the first electrode layer 31 and the electroluminescent material layer 33, and an electron injection layer 35 interposed between the second electrode layer 32 and the electroluminescent material layer 33.

Each of the first and second moisture barrier layers 4, 5 includes at least two inorganic films 41, 51 of a silicon-nitrogen-containing compound and at least one polymer film 42, 52 interposed between the inorganic films 41, 51.

In this embodiment, the silicon-nitrogen-containing compound is silicon carbonitride ($SiC_xN_y$). Preferably, the amount of silicon in the silicon carbonitride ranges from 30 to 52 atomic %, the amount of carbon in the silicon carbonitride ranges from 37 to 56 atomic %, and the amount of nitrogen in the silicon carbonitride ranges from 11 to 14 atomic %.

Preferably, the polymer film 42, 52 is made from a plasma polymerized polymer selected from polystyrene, polymethacrylate and polymethylmethacrylate.

Preferably, the substrate 2 is flexible, and is made from a material selected from polyethylene terephthalate (PET), polyethylene naphthalate (PEN), polyethersulfone and polyimide (PI).

In this embodiment, the first and second electrode layers 31, 32 are in contact with the first and second moisture barrier layers 4, 5, respectively.

Preferably, each of the inorganic films 41, 51 has a layer thickness ranging from 100 nm to less than 1000 nm and the polymer film 42, 52 has a layer thickness ranging from 100 nm to less than 1000 nm. The layer thicknesses of the inorganic films 41, 51 and the polymer film 42, 52 may vary according to the actual requirements.

Formation of each of the first and second moisture barrier layers 4, 5 is preferably performed by plasma enhanced chemical vapor deposition (PECVD). The first and second moisture barrier layers 4, 5 thus formed can exhibit a WVTR of less than $1\times10^{-2}$ g/m$^2$/day at 75% RH and 25° C., and a pin-hole density of less than 35/0.0379 mm$^2$. It is noted that the pin-hole density has a proportional relationship with the water vapor transmission rate.

Formation of the inorganic films 41, 51 is performed by introducing an inorganic source precursor into a PECVD reactor (not shown). Formation of the polymer film 42, 52 is performed by introducing a polymer source precursor into the PECVD reactor.

Examples of the inorganic source precursors for forming the silicon-nitrogen-containing compound in the PECVD reactor include 1,3,5-trimethyl-1,3,5-trivinylcyclotrisilane ($C_9H_{21}N_3Si_3$, VSZ), bis(dimethylamino)diethylsilane, N,N-dimethyltrimethylsilylamine, and N-methyl-aza-trimethylsilacyclopentane.

Preferably, formation of the inorganic films 41, 51 of the silicon-nitrogen-containing compound through PECVD is conducted at a substrate temperature ranging from room temperature to about 300° C. Table 1 shows the relation between the composition of each of the inorganic films 41, 51 of $SiC_xN_y$ and the substrate temperature used in forming the inorganic films 41, 51 of $SiC_xN_y$ in the PECVD process.

TABLE 1

| substrate temperature, ° C. | Composition, atomic % | | |
|---|---|---|---|
| | Si | C | N |
| 25 | 30.5 | 55.5 | 14.0 |
| 100 | 48.6 | 39.5 | 11.9 |
| 200 | 49.0 | 39.2 | 11.8 |
| 300 | 51.3 | 37.0 | 11.7 |

Figure 2:
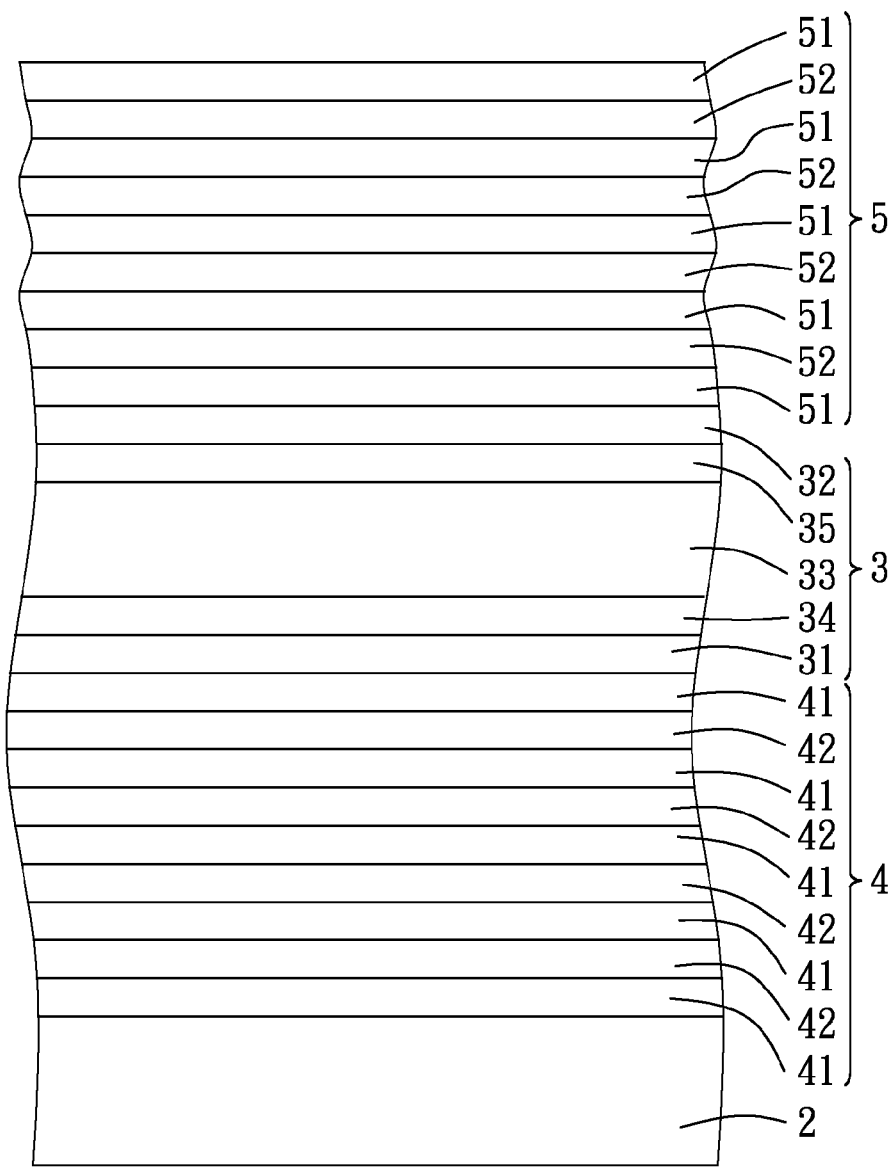
FIG. 2 is a schematic diagram of the second preferred embodiment of an electroluminescent device according to the present invention.

FIG. 2 illustrates the second preferred embodiment of an electroluminescent device 100 according to the present invention. The second preferred embodiment differs from the previous embodiment in that each of the first and second moisture barrier layers 4, 5 includes five inorganic films 41, 51 of the silicon-nitrogen-containing compound and four polymer films 42, 52 alternately disposed with the inorganic films 41, 51. Each of the polymer films 42, 52 is interposed between and is in contact with two adjacent ones of the inorganic films 41, 51.

Figure 3:
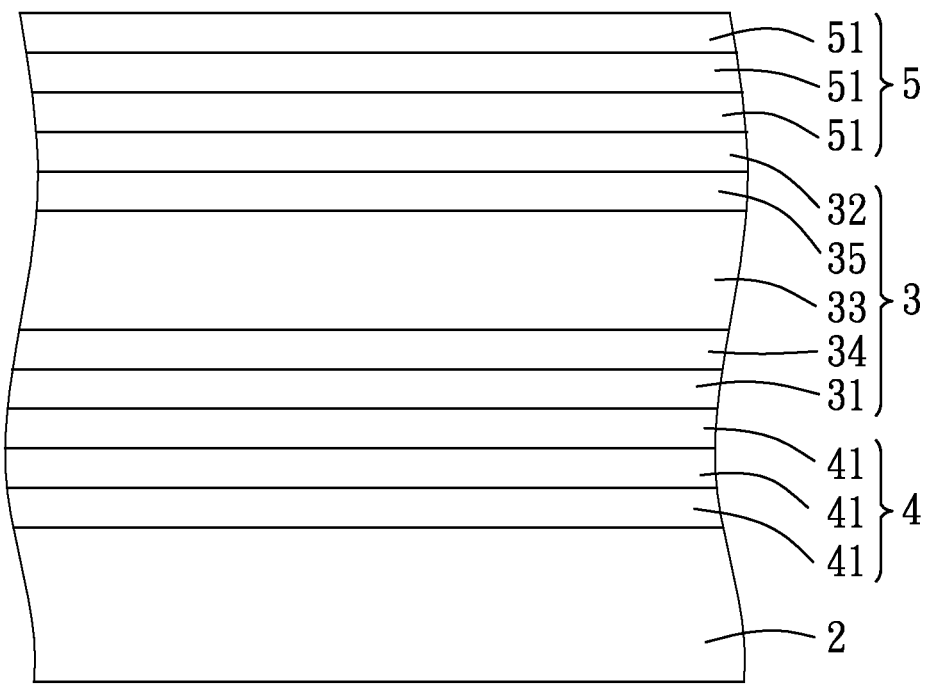
FIG. 3 is a schematic diagram of the third preferred embodiment of an electroluminescent device according to the present invention.

FIG. 3 illustrates the third preferred embodiment of an electroluminescent device 100 according to the present invention. The third preferred embodiment differs from the previous embodiments in that each of the first and second moisture barrier layers 4, 5 includes three inorganic films 41, 51 of the silicon-nitrogen-containing compound, which are stacked one above another. The polymer film 42, 52 is omitted in this embodiment. Assembly of the inorganic films 41, 51 has a water vapor transmission rate (WVTR) of less than $1\times10^{-2}$ g/m$^2$/day at 75% RH and 25° C.

The following examples and comparative examples are provided to illustrate the preferred embodiments of the invention, and should not be construed as limiting the scope of the invention.

EXAMPLE

Example 1(E1)

Forming a $SiC_xN_y$/Polystyrene (PS)/$SiC_xN_y$ Moisture Barrier Layer on a Substrate A polyethylene terephthalate (PET) substrate was used as a deposition substrate and was mounted on a back plate in a PECVD reactor (not shown). The electrode spacing of the PECVD reactor was 20 mm. 1,3,5-trimethyl-1,3,5-trivinylcyclotrisilane ($C_9H_{21}N_3Si_3$, VSZ) was stored in a VSZ-storing container and was heated to generate a VSZ vapor that was used as a $SiC_xN_y$ source precursor. The $SiC_xN_y$ source precursor was continuously carried into the PECVD reactor using an argon carrier gas so as to form a first $SiC_xN_y$ film having a layer thickness of 100 nm on the PET substrate. The flow rate of each of the $SiC_xN_y$ source precursor and the argon carrier gas was 20 sccm. The operating conditions of forming the first $SiC_xN_y$ film were as follows: an RF plasma was generated using an RF power of 50 W (power density=0.15 W/cm$^3$) and was introduced into the PECVD reactor; and the reactor pressure and the substrate temperature of the PECVD reactor were maintained at about 90 mTorr and about 25° C., respectively. Styrene monomer was stored in a polymer-storing container and was heated to generate a styrene vapor that was used as a polymer source precursor. After formation of the first $SiC_xN_y$ film on the PET substrate, the polymer source precursor was continuously carried into the PECVD reactor using the argon carrier gas so as to form a polystyrene (PS) film having a layer thickness of 100 nm on the first $SiC_xN_y$ film. The flow rate of each of the polymer source precursor and the argon carrier gas was 20 sccm. The operating conditions for forming the polystyrene film were the same as those for forming the first $SiC_xN_y$ film. After formation of the polystyrene film on the first $SiC_xN_y$ film, the $SiC_xN_y$ source precursor was again continuously carried into the PECVD reactor using the argon carrier gas so as to form a second $SiC_xN_y$ film having a layer thickness of 100 nm on the polystyrene film. The flow rate of each of the $SiC_xN_y$ source precursor and the argon carrier gas was 20 sccm for forming the second $SiC_xN_y$ film. The operating conditions for forming the second $SiC_xN_y$ film were the same as those for forming the first $SiC_xN_y$ film. Assembly of the first and second $SiC_xN_y$ films and the polymer film (i.e., $SiC_xN_y$/PS(100 nm)/$SiC_xN_y$ moisture barrier layer) thus formed has a WVTR of $7\times10^{-3}$ g/m$^2$/day at 75% RH and 25° C.

Example 2(E2)

Forming a $SiC_xN_y$/PS/$SiC_xN_y$ Moisture Barrier Layer on a Substrate

Preparation of the moisture barrier layer on the PET substrate for Example 2 was similar to that of Example 1 except for the layer thickness of the polystyrene film of Example 2.

The layer thickness of the polystyrene film of Example 2 is 500 nm. The $SiC_xN_y$/PS(500 nm)/$SiC_xN_y$ moisture barrier layer thus formed has a WVTR of $3.8\times10^{-3}$ g/m²/day at 75% RH and 25° C.

Example 3(E3)

Forming a $(SiC_xN_y/PS)_4/SiC_xN_y$ Moisture Barrier Layer on a Substrate

Preparation of the moisture barrier layer on the PET substrate for Example 3 was similar to that of Example 1, except that after formation of the second $SiC_xN_y$ film, three more $SiC_xN_y$ films and three more polystyrene films were formed under the same operating conditions as those of Example 1. The five $SiC_xN_y$ films and the four polystyrene films were alternatively formed. Each of the five $SiC_xN_y$ films and the four polystyrene films has a layer thickness of 100 nm. The $(SiC_xN_y/PS)_4/SiC_xN_y$ moisture barrier layer thus formed has a WVTR of $8\times10^{-5}$ g/m²/day at 75% RH and 25° C. The structure of $(SiC_xN_y/PS)_4$ represents $SiC_xN_y$/PS/$SiC_xN_y$/PS/$SiC_xN_y$/PS/$SiC_xN_y$/PS.

Example 4(E4)

Forming a $SiC_xN_y/SiC_xN_y/SiC_xN_y$ Moisture Barrier Layer on a Substrate

Preparation of the moisture barrier layer on the PET substrate for Example 4 was similar to that of Example 1, except that the polystyrene film was replaced by a $SiC_xN_y$ film. The three $SiC_xN_y$ films were formed successively in a manner that after forming the first $SiC_xN_y$ film, introduction of the $SiC_xN_y$ source precursor, the argon carrier gas and the RF plasma into the PECVD reactor was stopped for a predetermined period of time before deposition of the second $SiC_xN_y$ film and that after forming the second $SiC_xN_y$ film, introduction of the $SiC_xN_y$ source precursor, the argon carrier gas and the RF plasma into the PECVD reactor was stopped for another predetermined period of time before deposition of the third $SiC_xN_y$ film. Each of the three $SiC_xN_y$ films has a layer thickness of 100 nm. The $SiC_xN_y/SiC_xN_y/SiC_xN_y$ moisture barrier layer thus formed has a WVTR of $6\times10^{-3}$ g/m²/day at 75% RH and 25° C., and a pin-hole density of 4/0.0379 mm².

Comparative Example 1(CE1)

Forming a $SiC_xN_y$ Moisture Barrier Layer on a Substrate

The moisture barrier layer of Comparative Example 1 includes solely one $SiC_xN_y$ film having a layer thickness of 100 nm. The operating conditions for forming the $SiC_xN_y$ film of Comparative Example 1 were similar to those for forming the first $SiC_xN_y$ film of Example 1. The 100 nm $SiC_xN_y$ moisture barrier layer thus formed has a WVTR of $5\times10^{-2}$ g/m²/day at 75% RH and 25° C., and a pin-hole density of 42/0.0379 mm².

Comparative Example 2(CE2)

Forming a $SiC_xN_y$ Moisture Barrier Layer on a Substrate

Preparation of the moisture barrier layer on the PET substrate of Comparative Example 2 was similar to that of Comparative Example 1, except for the layer thickness of the $SiC_xN_y$ film. The layer thickness of the $SiC_xN_y$ film of Comparative Example 2 is 200 nm. The 200 nm $SiC_xN_y$ moisture barrier layer thus formed has a WVTR of $4\times10^{-2}$ g/m²/day at 75% RH and 25° C., and a pin-hole density of 35/0.0379 mm².

By forming a plurality of the inorganic films 41, 51 and optionally at least one polymer film 42, 52 interposed between two of the inorganic films 41, 51 in the electroluminescent device 100 of this invention, the aforesaid drawback associated with the prior art can be alleviated.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. An electroluminescent device comprising:
   a substrate;
   an electroluminescent layered structure disposed over said substrate and including first and second electrode layers and an electroluminescent material layer disposed between said first and second electrode layers; and
   a first moisture barrier layer in contact with said electroluminescent layered structure for preventing moisture from diffusing into said electroluminescent layered structure;
   wherein said first moisture barrier layer includes at least two inorganic films of a silicon-nitrogen-containing compound and at least one polymer film interposed between said inorganic films;
   wherein said polymer film is made from a plasma polymerized polymer selected from polystyrene, polymethacrylate and polymethylmethacrylate;
   wherein said first moisture barrier layer has a water vapor transmission rate of less than $1\times10^{-2}$ g/m²/day at 75% RH and 25° C.

2. The electroluminescent device of claim 1, wherein said silicon-nitrogen-containing compound is silicon carbonitride.

3. The electroluminescent device of claim 2, wherein the amount of silicon in said silicon carbonitride ranges from 30 to 52 atomic %, the amount of carbon in said silicon carbonitride ranges from 37 to 56 atomic %, and the amount of nitrogen in said silicon carbonitride ranges from 11 to 14 atomic %.

4. The electroluminescent device of claim 1, wherein said substrate is made from a material selected from polyethylene terephthalate, polyethylene naphthalate, polyethersulfone and polyimide.

5. The electroluminescent device of claim 1, further comprising a second moisture barrier layer, said first moisture barrier layer being interposed between said substrate and said electroluminescent layered structure, said electroluminescent layered structure being interposed between said first and second moisture barrier layers.

6. The electroluminescent device of claim 5, wherein said second moisture barrier layer has a structure the same as that of said first moisture barrier layer.

7. The electroluminescent device of claim 5, wherein said first and second electrode layers are in contact with said first and second moisture barrier layers, respectively.

8. The electroluminescent device of claim 1, wherein said substrate is flexible, said first moisture barrier layer being deposited on said substrate through plasma enhanced chemical vapor deposition.

9. An electroluminescent device comprising:

a substrate;

an electroluminescent layered structure disposed over said substrate and including first and second electrode layers and an electroluminescent material layer disposed between said first and second electrode layers; and a moisture barrier layer in contact with said electroluminescent layered structure for preventing moisture from diffusing into said electroluminescent layered structure;

wherein said moisture barrier layer includes a plurality of inorganic films of silicon carbonitride, said inorganic films being stacked one above another; and wherein assembly of said inorganic films has a water vapor transmission rate of less than $1 \times 10^{-2}$ g/m$^2$/day at 75% RH and 25° C.

10. The electroluminescent device of claim 9, wherein the amount of silicon in said silicon carbonitride ranges from 30 to 52 atomic %, the amount of carbon in said silicon carbonitride ranges from 37 to 5 atomic %, and the amount of nitrogen in said silicon carbonitride ranges from 11 to 14 atomic %.

* * * * *